United States Patent
Pike et al.

(10) Patent No.: US 6,479,879 B1
(45) Date of Patent: Nov. 12, 2002

(54) LOW DEFECT ORGANIC BARC COATING IN A SEMICONDUCTOR STRUCTURE

(75) Inventors: Christopher Lee Pike, Vancouver, WA (US); Alexander H. Nickel, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/753,809

(22) Filed: Jan. 3, 2001

Related U.S. Application Data
(60) Provisional application No. 60/249,336, filed on Nov. 16, 2000.

(51) Int. Cl.[7] ............................................. H01L 31/0232
(52) U.S. Cl. ........................... 257/437; 438/72; 438/636
(58) Field of Search ........................... 257/437; 438/48, 438/72, 636

(56) References Cited

U.S. PATENT DOCUMENTS

| | | | |
|---|---|---|---|
| 5,077,085 A | * | 12/1991 | Schnur et al. ................. 427/98 |
| 5,079,600 A | * | 1/1992 | Schnur et al. ............... 257/750 |
| 5,208,067 A | * | 5/1993 | Jones et al. ..................... 427/96 |
| 5,401,316 A | * | 3/1995 | Shiraishi et al. ............. 118/689 |
| 5,407,529 A | * | 4/1995 | Homma ......................... 156/643 |
| 5,702,767 A | * | 12/1997 | Peterson et al. .......... 427/407.1 |
| 5,736,773 A | * | 4/1998 | Schmid ......................... 257/437 |
| 5,858,621 A | * | 1/1999 | Yu et al. ....................... 430/313 |
| 5,886,391 A | * | 3/1999 | Niroomand et al. ........ 257/437 |
| 6,057,587 A | * | 5/2000 | Ghandehari et al. ........ 257/437 |
| 6,106,995 A | * | 8/2000 | Dixit et al. .................. 430/270.1 |
| 6,107,177 A | * | 8/2000 | Lu et al. ....................... 438/597 |
| 6,165,684 A | * | 12/2000 | Mizutani et al. ........... 430/271.1 |
| 6,323,139 B1 | * | 11/2001 | Moore et al. ................ 438/786 |
| 6,354,620 B1 | * | 3/2002 | Budden et al. ............ 280/728.1 |

* cited by examiner

*Primary Examiner*—David Nelms
*Assistant Examiner*—Andy Huynh

(57) ABSTRACT

In providing a bottom antireflective coating (BARC) in a semiconductor structure, a primer layer, for example, hexamethyldisilazane (HMDS), is provided on a substrate, and the BARC is formed on the primer. This results in a substantially defect free BARC layer, having a more uniform reflectivity which in turn leads to improve to photolithographic pattern resolution.

10 Claims, 4 Drawing Sheets

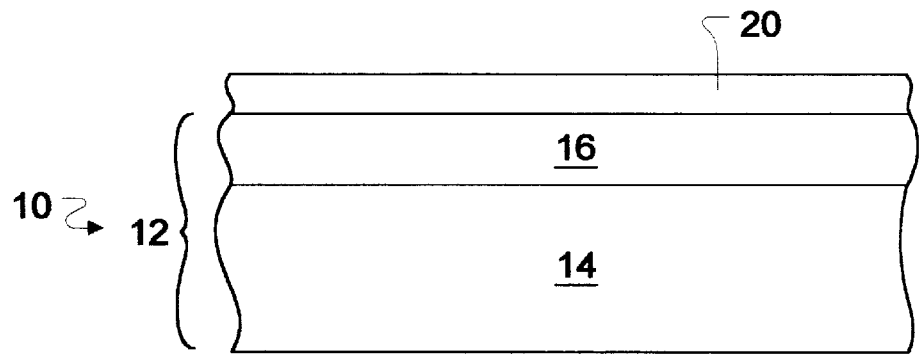
FIGURE 1    (PRIOR ART)
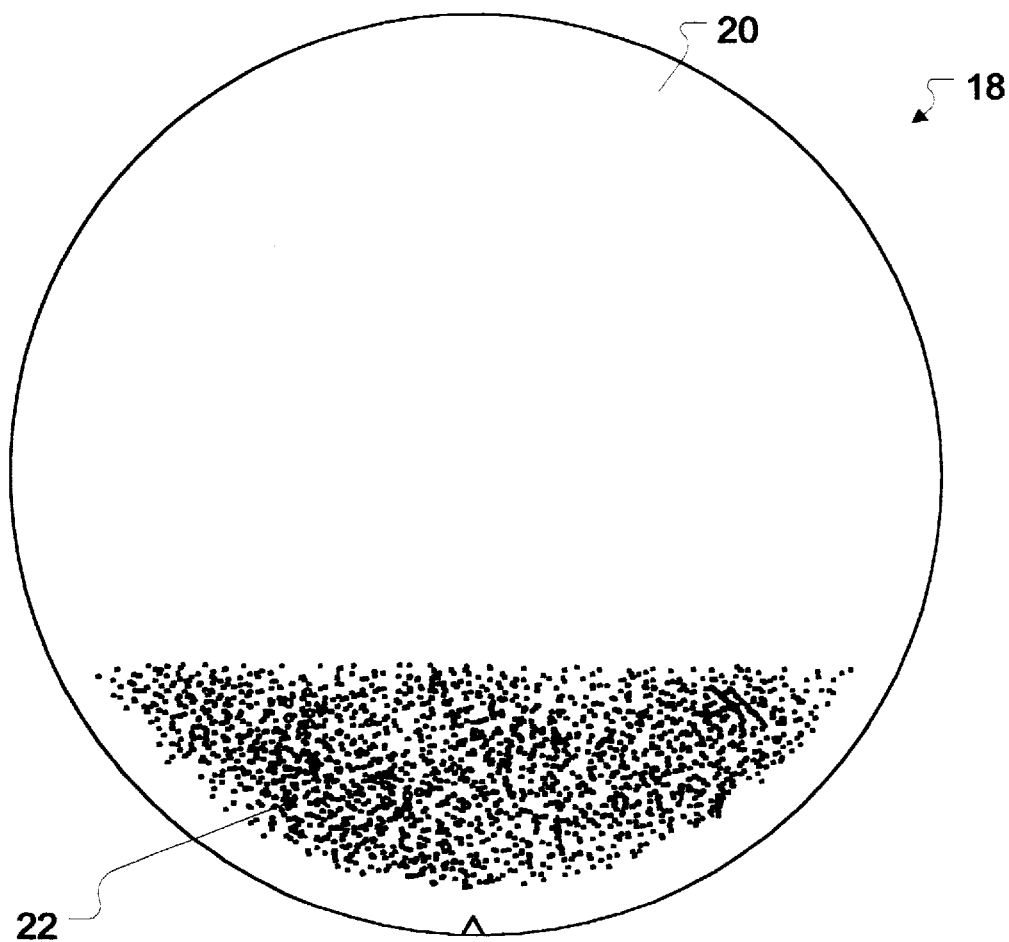
FIGURE 2    (PRIOR ART)

LOW DEFECT ORGANIC BARC COATING IN A SEMICONDUCTOR STRUCTURE

REFERENCE TO RELATED CASE

This application is based on and claims the benefit of U.S. Provisional Application Ser. No. 60/249336, filed Nov. 16, 2000.

BACKGROUND OF THE INVENTION

1. Field of the Invention

This invention relates generally to semiconductor devices and manufacturing processes, and more particularly, to formation of a bottom antireflective coating (BARC) in a semiconductor structure.

2. Discussion of the Related Art

In semiconductor technology it is well-known to provide a bottom antireflective coating (BARC) on a surface beneath a layer of photoresist, to aid in the patterning of images. The BARC cuts down on light scattering into the resist, which helps in defining images. The BARC also minimizes standing waves effects and improves image contrast.

In order to achieve these advantages, the BARC must be relatively defect free. Such a uniform BARC would provide a more uniform reflectivity, in turn leading to better photolithographic pattern resolution.

Using a normal spinon technique to apply a BARC on a substrate can result in numerous defects therein in the form of variations in thickness, leading to the problems described above.

Therefore, what is needed is a method for forming a low defect BARC layer, so that manufacturing efficiency is increased.

SUMMARY OF THE INVENTION

In the present method, rather than applying a BARC directly onto a substrate, a primer, for example, vapor deposited hexamethyldisilazane (HMDS) along with a small amount of trimethylsilyldiethylamine (TMSDEA) as an additive, is vapor deposited on the substrate, and the BARC is formed on the primer. Then a layer of photoresist may be formed over the BARC. The inclusion of the primer layer results in a low defect BARC, in fact eliminating defects due to variations in thickness, so that the BARC provide uniform reflectivity to in turn provide improved photolithographic pattern resolution The present invention is better understood upon consideration of the detailed description below, in conjunction with the accompanying drawings. As will become readily apparent to those Gilled in the art from the following description, there is shown and described an embodiment of this invention simply by way of the illustration of the best mode to carry out the invention. As will be realized, the invention is capable of other embodiments and its several details are capable of modifications and various obvious as, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

FIG. 1 is a sectional view of a semiconductor structure including a substrate having a BARC coating thereon, in accordance with the prior art;

FIG. 2 is a plan view of a wafer having a structure as shown in FIG. 1, showing defects there accordance with the prior art;

DETAILED DESCRIPTION

Reference is now made in detail to a specific embodiment of the present invention which illustrates the best mode presently contemplated by the inventors for practicing the invention.

Figure 3:
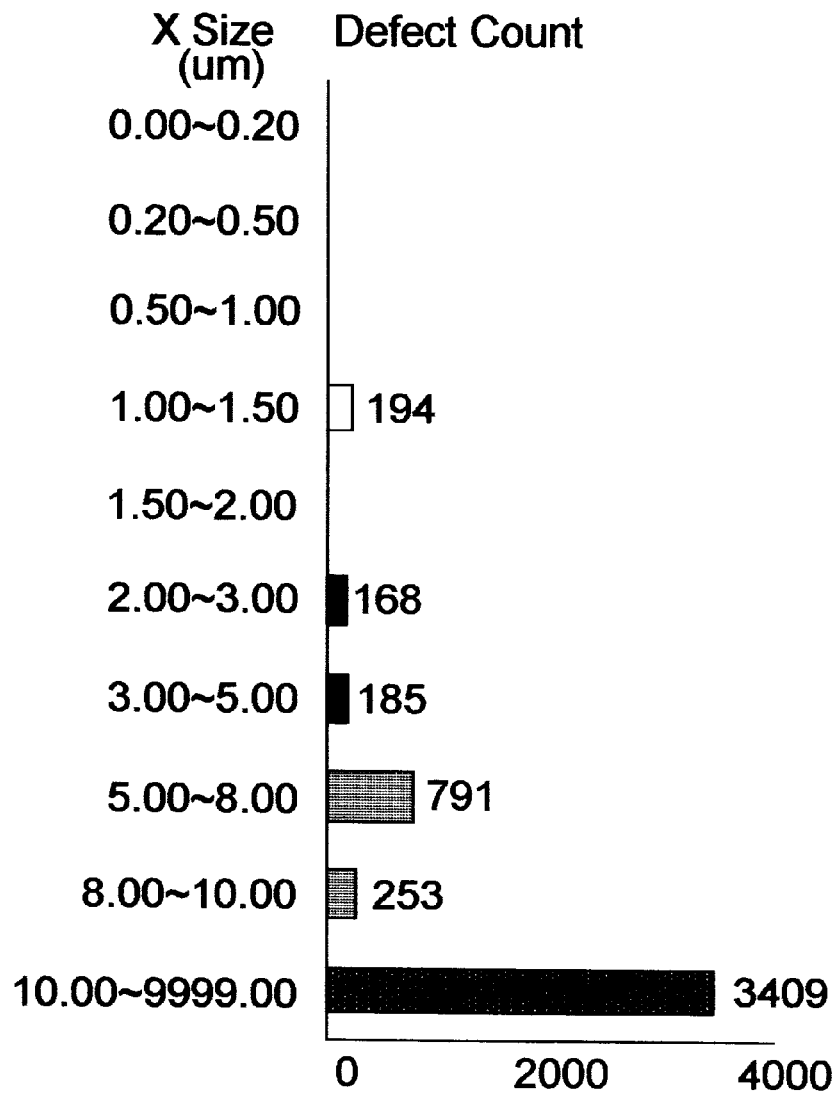
FIG. 3 is a graph showing distribution of defect count indicated in FIG. 2 by size thereof in accordance with the prior art.

FIG. 1 shows a semiconductor structure 10 including a substrate 12, the substrate 12 in this illustrative embodiment made up of a silicon layer 14 and layer 16 thereon, for example silicon dioxide ($SiO_2$), silicon oxide (SiON), tetraethyl orthosilicate TEOS), fluorine doped TEOS (FTEOS), low k dielectric, metal, polysilicon, silicon nitride ($Si_3N_4$), or some other appropriate material The semiconductor structure 10 takes the form of a typical wafer 18 (FIG. 2). The substrate 12 has formed thereon a BARC 20 in contact with the layer 16, being of organic material, for example a polyimide or a polysulfone. The BARC 20 was formed using conventional BARC material, dispensing and casting techniques, along with conventional edge bead removal, backside rinse, drying, baking and cooling. Then, the BARC 20 was scanned for defects using the KLA 2132. As will be seen in FIG. 2, a large number of defects 22 (including thickness variations, non-visual defects, equipment related defects, and bubble/void defects) was indicated, the testing being programmed to cease when the defect count reached 5000, which count was reached prior to the entire wafer 18 being scanned (FIG. 2). A distribution of defect count by size is shown in FIG. 3. As will be seen, a high number of large defects results from this described method, leading to the problems set forth above.

FIG. 4 again shows a semiconductor structure 30 including a substrate 32, the substrate 32 in this embodiment made up of a silicon layer 34 and layer 36 thereon. The material of layer 36 may be as specified as for layer 16, or any other suitable material. The semiconductor structure 30 again takes the form of a wafer 38 as shown in FIG. 5. The layer 36 of the substrate 32 has deposited thereon a primer layer 40. The primer layer 40 is formed of hexamethyldisilazane HMDS), which is commonly used as a primer material on which photoresist is directly deposited The primer layer may include a small amount, for example 1%, trimethylsilyldiethylamine IDEA). The layer 40 is applied by vapor deposition at 130° C. for 60 seconds. The resulting structure is allowed to cool for 60 seconds to 20.5° C.

Next, a BARC 42 is applied to the primer layer 40. Again, the BARC 42 is an organic layer, for example a polyimide or a polysulfone. Using a TEL (Tokyo Electronics limited) Mark VIII track system, the BARC material, in this embodiment AZ's KrF 17B, is dispensed m a volume in the range of 3–5 cc, in this embodiment at a dispense rate of 3.5 cc, at 1 cc/second, in the range of from 1000–2000 RPM in this embodiment 1700 RPM The casting speed is in the range of from 2300–2700 RPM in this embodiment 2400 RPM, and casting is undertaken for 30 seconds. The BARC 42 thickness in this embodiment is in the range of 90 nm to 160 nm, in this embodiment approximately 140 nm thick. After edge bead removal and backside rinse, a drying step is undertaken at 3500 RPM for 25 seconds. The resulting sure including the BARC is baked at 185° C. for 60 seconds, and the structure is cooled for 60 seconds to 20.5° C.

As will be seen in FIG. 5, a very small number of relatively small defects 44 is indicated. Upon further investigation, it was revealed that all of the defects 44 fall into the category of bubble/void defects. That is, defects due to thickness variations were completely eliminated.

Figure 6:
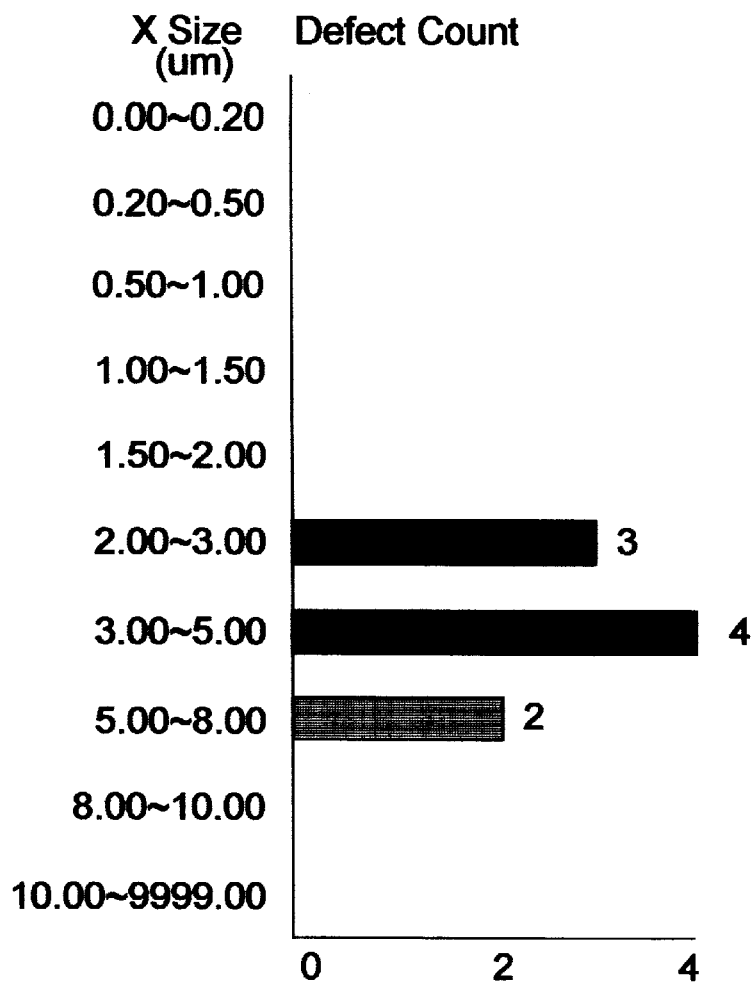
FIG. 6 is a graph showing distribution of defect count indicated in FIG. 5 by size thereof, in accordance with the present invention.

A distribution of defect count by size is shown in FIG. 6. As will be seen, not only are defects lower in number, but they are of generally smaller size than those indicated in the above prior art example. This reduction in defects in the BARC 42 and on of defects due to thickness variations is due to the inclusion of the primer layer 40 on which the BARC is formed.

Figure 4:
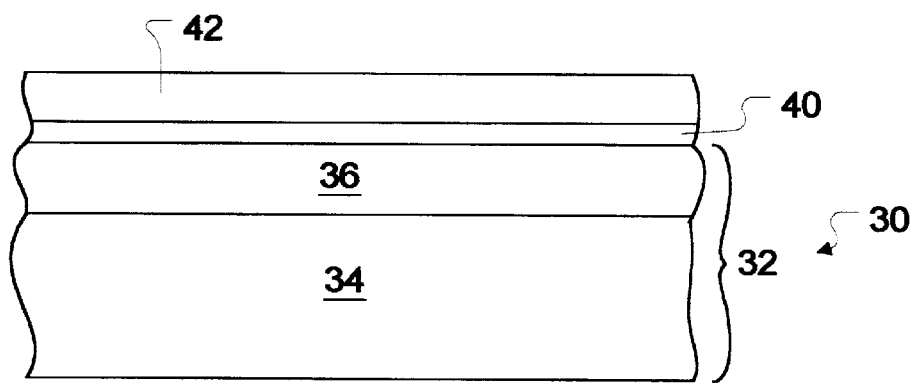
FIG. 4 is a sectional view of a semiconductor structure including a substrate having a primer and a BARC coating thereon, in accordance with the present invention.
Figure 5:
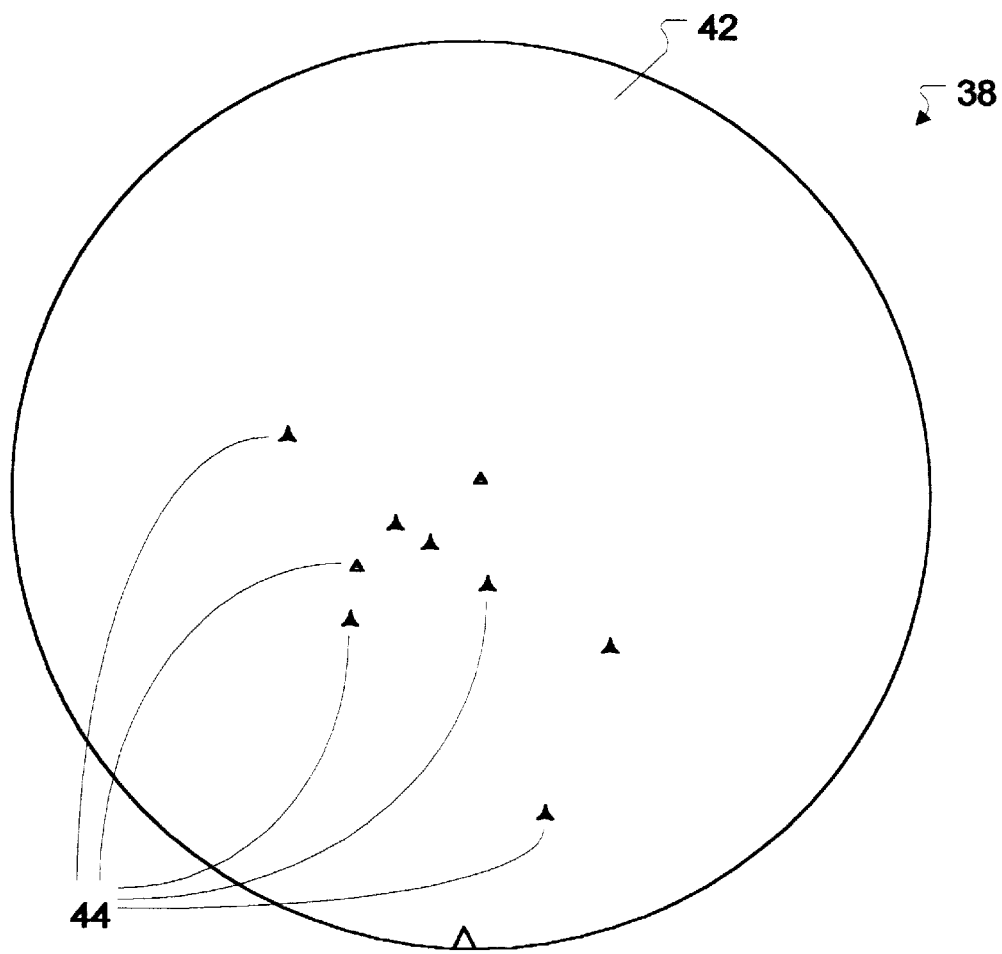
FIG. 5 is a plan view of a wafer having a structure as shown in FIG. 4, in accordance with a present invention.
Figure 7:
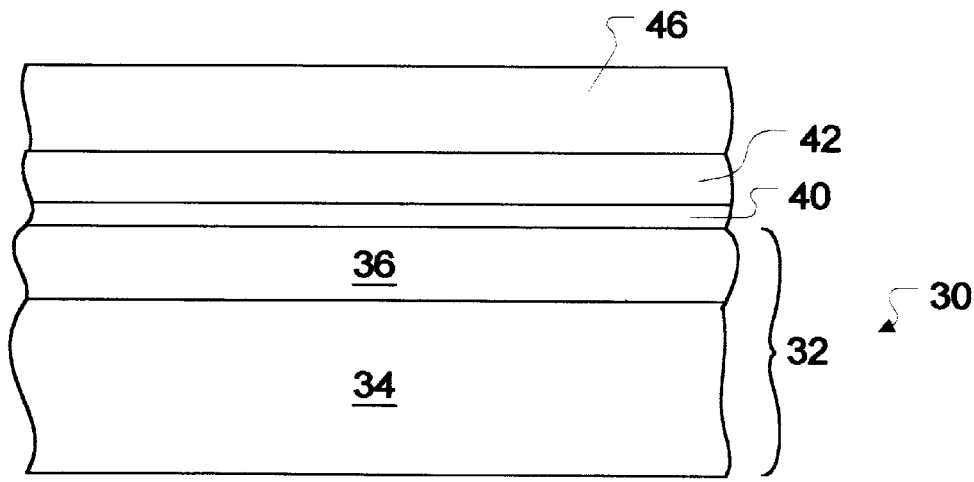
FIG. 7 is a sectional view similar to that shown in FIG. 4, and further showing a photoresist layer on the primer layer.

FIG. 7 shows the structure of FIG. 4 with a photoresist layer 46 provided on the BARC 42. With a uniform (thickness variation defect free) BARC 42, more uniform reflectivity thereof is achieved, leading to improved photolithographic pattern resolution.

The foregoing description of the embodiment of the invention has been presented for purposes of illustration and description. It is not intended to be exhaustive or to limit the invention to the precise form disclosed Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled

What is claimed is:

1. A semiconductor structure comprising:

a substrate, a primer on the substrate; and an antireflective coating on the primer.

2. The semiconductor structure of claim 1 and further comprising a photoresist layer on the antireflective coating.

3. The structure of claim 1 wherein the primer comprises HMDS.

4. The sure of claim 2 wherein the primer comprises HMDS.

5. The structure of claim 3 wherein the thickness of the antireflective coating is in the range of from 90 nm to 160 nm.

6. The structure of claim 5 wherein the thickness of the antireflective coat is approximately 140 nm.

7. The structure of claim 4 wherein the antireflective coating is an organic antireflective coating.

8. The structure of claim 7 wherein the antireflective coating is a polyimide.

9. The structure of claim 7 wherein the antireflective coating is a polysulfone.

10. The structure of claim 4 wherein the primer further comprises TMSDEA.

\* \* \* \* \*